(12) United States Patent
Raley et al.

(10) Patent No.: US 10,950,460 B2
(45) Date of Patent: Mar. 16, 2021

(54) METHOD UTILIZING USING POST ETCH PATTERN ENCAPSULATION

(71) Applicant: Tokyo Electron Limited, Tokyo (JP)

(72) Inventors: Angelique Raley, Albany, NY (US); Andrew Metz, Albany, NY (US); Cory Wajda, Albany, NY (US); Junling Sun, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/533,354

(22) Filed: Aug. 6, 2019

(65) Prior Publication Data
US 2020/0051832 A1   Feb. 13, 2020

Related U.S. Application Data

(60) Provisional application No. 62/715,995, filed on Aug. 8, 2018, provisional application No. 62/737,308, filed on Sep. 27, 2018.

(51) Int. Cl.
*H01L 21/3213* (2006.01)
*H01L 21/56* (2006.01)
(Continued)

(52) U.S. Cl.
CPC .. *H01L 21/32138* (2013.01); *H01L 21/31111* (2013.01); *H01L 21/56* (2013.01); *H01L 21/0228* (2013.01); *H01L 21/32136* (2013.01)

(58) Field of Classification Search
CPC .............. H01L 21/32138; H01L 21/56; H01L 21/31111; H01L 21/32136; H01L 21/0228; H01L 21/02071
See application file for complete search history.

(56) References Cited

U.S. PATENT DOCUMENTS

| 7,018,482 B1 * | 3/2006 | Geomini ........... H01L 21/76224 134/18 |
| 2013/0115778 A1 | 5/2013 | Xue et al. |

(Continued)

FOREIGN PATENT DOCUMENTS

JP    2015050358 A    3/2015

OTHER PUBLICATIONS

International Search Report issued in Application No. PCT/US2019/045304 dated Nov. 29, 2019 (3 pages).

*Primary Examiner* — Kyoung Lee
(74) *Attorney, Agent, or Firm* — Rothwell, Figg, Ernst & Manbeck, P.C.

(57) ABSTRACT

A process is provided in which etched layer(s) are protected from residues or defects caused by or resulting from exposure to atmospheric conditions. Protection is provided through the formation of an encapsulation layer post etch. In one embodiment, the encapsulation is provided by a thin layer formed in an atomic layer deposition (ALD) process. The thin layer prevents the etched layer(s) from exposure to air. This encapsulation process may take place after the etch process thus allowing for substrates to be subsequently exposed to atmospheric conditions with little or no queue time constraints being needed for staging subsequent wet clean processing steps. In one embodiment, the encapsulation process may be performed with no vacuum break between the etch process and the encapsulation process. In one embodiment, the encapsulation film is compatible with subsequent wet process steps and can be removed during this wet process steps without adverse effects.

21 Claims, 6 Drawing Sheets

(51) Int. Cl.
*H01L 21/311* (2006.01)
*H01L 21/02* (2006.01)

(56) References Cited

U.S. PATENT DOCUMENTS

| | | | |
|---|---|---|---|
| 2013/0302989 A1* | 11/2013 | Kenny | H01L 21/31144 438/700 |
| 2015/0079799 A1 | 3/2015 | Nemani et al. | |
| 2015/0262869 A1 | 9/2015 | Naik et al. | |
| 2018/0144980 A1 | 5/2018 | Basu et al. | |

* cited by examiner

METHOD UTILIZING USING POST ETCH PATTERN ENCAPSULATION

This application claims priority to U.S. Provisional Patent Application No. 62/715,995, entitled, "Method Utilizing Using Post Etch Pattern Encapsulation," filed Aug. 8, 2018 and U.S. Provisional Patent Application No. 62/737,308, entitled, "Method Utilizing Using Post Etch Pattern Encapsulation," filed Sep. 27, 2018; the disclosures of which are expressly incorporated herein, in their entirety, by reference.

BACKGROUND

The present disclosure relates to the processing of substrates. In particular, it provides a method for patterning of substrates.

It has been found that in substrate processing techniques, after etching certain layers a variety of residues can "grow" on a substrate post etch. In some cases, such residue growth can be dependent upon the length of time that the substrate is exposed to atmospheric conditions. For example, with regard to etching of metallic layers, it has been proposed that etch species react with the metal layer and air moisture to form metallic salts. In one embodiment, it has been proposed that fluorine from fluorocarbon based etch techniques react with air moisture to form hydrofluoric acid compounds. The hydrofluoric acid then reacts with oxidized surfaces of the metallic layer to from a metallic salt. Thus, it has been proposed that the metallic residue growth results from a reaction between the metal and an acid. In the fluorocarbon etch example, the acid may result from fluorine remaining on or in the metallic layer and hydrogen coming from the atmosphere. In one embodiment, such mechanisms have been proposed as the source of residues that grow on titanium nitride layers post etch. In other embodiments, the hydrofluoric acid has been proposed to react with cobalt layers post etch as the source of residues that grow on cobalt.

To address such concerns, control of the exposure of etched layers to atmospheric conditions prior to subsequent processing steps has been proposed. Specifically, queue time limits have been placed on how long a substrate may be exposed to atmospheric conditions before subsequent processing steps are performed. For example, it has been found that even two hours of atmospheric exposure may result in residue defects forming on the etched structures. In this manner, queue time control limits the exposure to atmospheric conditions, resulting in less residue growth post etch. In one embodiment, queue time limits are known to be provided between a plasma etch step and a subsequent wet processing step. For example, in one embodiment, after etching a structure containing a titanium nitride layer a wet clean step may be performed, such as a Standard Clean 1 (SC1) wet clean. Queue time control of exposure to atmosphere may be required after the etch and before the SC1 wet clean processing so as to lessen residue growth. It will be recognized that similar queue time control limits may be required between the etching of other substrate layers and other cleans (including both acidic and alkaline cleans). Such queue time controls, however, place undesirable constraints on the substrate processing manufacturing flow.

Thus, it would be desirable to utilize a more robust process flow in conjunction substrate etching that relaxes queue time control requirements post etch.

SUMMARY

In one embodiment, a process is provided in which etched layer(s) are protected from residues and/or defects caused by or resulting from exposure to atmospheric conditions. The protection is provided through the formation of an encapsulation layer post etch. In one embodiment, the encapsulation is provided by a thin layer formed in an atomic layer deposition (ALD) process. The thin layer prevents the etched layer(s) from being exposed to air. This encapsulation process may take place after the etch process thus allowing for substrates to be subsequently exposed to atmospheric conditions with little or no queue time constraints being needed for staging subsequent wet clean processing steps. In one embodiment, the encapsulation process may be performed with no vacuum break between the etch process and the encapsulation process such that the substrate is maintained under vacuum. In one embodiment, the encapsulation film is compatible with subsequent wet process steps and can be easily removed during this wet process steps without adverse effects.

In one embodiment, a method of processing a substrate so as to extend a queue time between at least an etch step and a second process step is provided. The method may comprise etching at least one layer to form a patterned structure on the substrate, the patterned structure being sensitive to exposure to atmospheric conditions, the patterned structure having a plurality of surfaces. The method further comprises encapsulating at least a portion of the plurality of surfaces with an encapsulation layer, the encapsulation layer allowing for an extended queue time between the etch step and the second process step. Further, the method comprises removing encapsulation layer as part of the second process step.

In another embodiment, a method of processing a substrate so as to extend a queue time between at least an etch step and a second process step, the second process step being a wet processing process, is provided. The method may comprise etching at least one layer to form a patterned structure on the substrate, the patterned structure being sensitive to exposure to atmospheric conditions, the patterned structure having a plurality of surfaces. The method further comprises encapsulating at least a portion of the plurality of surfaces with an encapsulation layer, the encapsulation layer allowing for an extended queue time between the etch step and the second process step. The method also comprises exposing the encapsulation layer to the wet processing process and removing the encapsulation layer from the substrate as part of the wet processing process.

In still another embodiment, a method of processing a substrate so as to extend a queue time between at least an etch step and a second process step is provided. The method may comprise etching at least a first layer to form a plurality of exposed surfaces on the substrate, at least one of the exposed surfaces comprising metal, the at least one of the exposed surfaces comprising metal being sensitive to exposure to atmospheric conditions. The method also comprises encapsulating at least a portion of the plurality of exposed surfaces with an encapsulation layer, the encapsulation layer allowing for an extended queue time between the etch step and the second process step. The method further comprises removing the encapsulation layer as part of the second process step.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

In one embodiment, a process is provided in which etched layer(s) are protected from residues and/or defects caused by or resulting from exposure to atmospheric conditions. The protection is provided through the formation of an encapsulation layer post etch. In one embodiment, the encapsulation is provided by a thin layer formed in an atomic layer deposition (ALD) process. The thin layer prevents the etched layer(s) from being exposed to air. This encapsulation process may take place after the etch process thus allowing for substrates to be subsequently exposed to atmospheric conditions with little or no queue time constraints being needed for staging subsequent wet clean processing steps. In one embodiment, the encapsulation process may be performed with no vacuum break between the etch process and the encapsulation process. In one embodiment, the encapsulation film is compatible with subsequent wet process steps and can be easily removed during this wet process steps without adverse effects.

Figure 1:
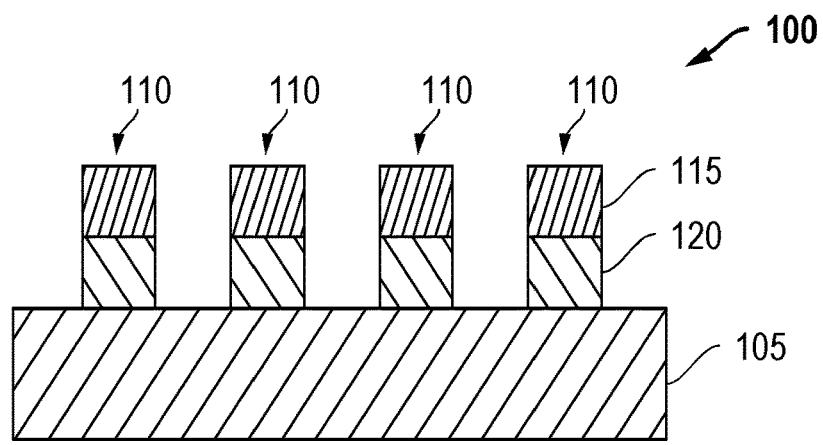
FIGS. 1-3 illustrate an exemplary substrate process flow utilizing an encapsulation layer to provide extended queue time control.
Figure 2:
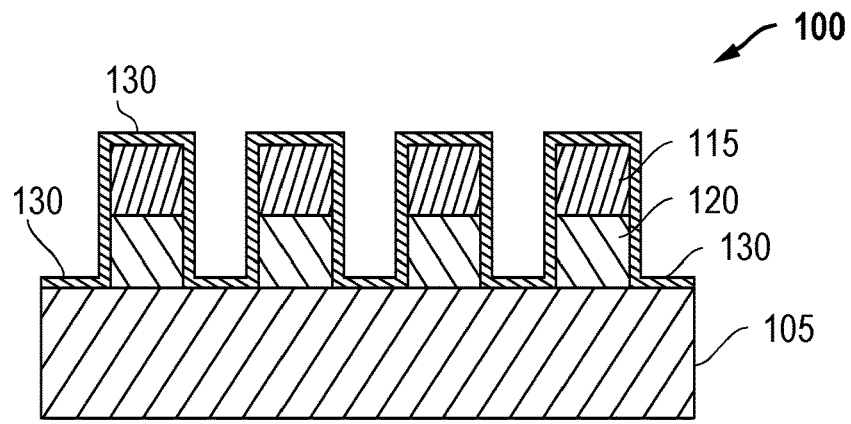
Figure 3:
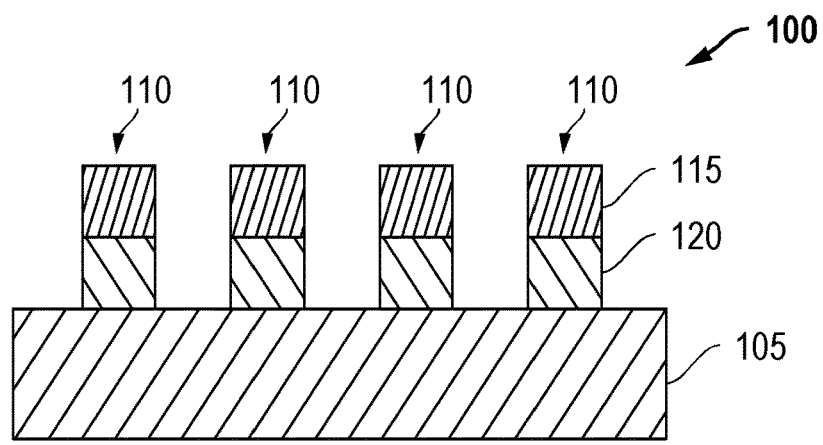

One embodiment of a process integration flow utilizing the encapsulation techniques described herein is shown in FIGS. 1-3.

As shown in FIG. 1, a substrate 100 is provided. The substrate 100 includes patterned structures 110 and underlying layer(s) 105. The patterned structures 110 may be formed by an etch process. In one embodiment, the etch process may be a plasma etch process. Substrate 100 may be any substrate for which the use of patterned features is desirable. For example, in one embodiment, substrate 100 may be a semiconductor substrate having one or more semiconductor processing layers formed thereon. In one embodiment, the substrate 100 may be a substrate that has been subject to multiple semiconductor processing steps which yield a wide variety of structures and layers, all of which are known in the substrate processing art. Thus, it will be recognized that underlying layer(s) 105 may include a wide variety of structures and layers, as known in the art. In one exemplary embodiment, the patterned structures 110 may be comprised of one or more layers. As shown in FIGS. 1-3, the patterned structures 110 comprise two layers, a first layer 115 and a second layer 120. It will be recognized that the patterned structures 110 shown in the figures are merely exemplary and the patterned structures 110 may be formed of more or less layers. Further, it will be recognized that the pattern of the patterned structures 110 is merely exemplary and other patterns may be utilized while still gaining the advantages of the techniques described herein.

FIG. 1 illustrates the patterned structures 110 post etch. After formation of the patterned structures 110, an encapsulation layer 130 may be provided over the patterned structures as shown in FIG. 2. The encapsulation layer 130 protects the patterned structures 110 so that the substrate 100 may be exposed to atmospheric conditions without the adverse effects of the atmosphere reacting with the patterned structures to form residues and/or defects. Specifically, as shown, the encapsulation layer 130 covers at least some of the exposed surfaces of the patterned structure to act as a barrier between the patterned structures 110 and the atmosphere. In this manner, the use of the encapsulation layer 130 allows for post etch process queue time limits to be relaxed. More particularly, in one embodiment, queue time limits between the etch which formed the patterned structures 110 and another subsequent process step may be provided.

Though not shown in FIG. 1, it will be recognized that the surfaces of the patterned structures 110 may be contain undesirable residues and etch reaction products. The use of the encapsulation layer 130 provides for a barrier mechanism that prevents or limits such residues or etch reaction products from (1) reacting with the atmosphere and (2) causing more residues and/or defects or the growth of residues and/or defect.

In one embodiment, the formation of the encapsulation layer 130 may be performed after the etching of the patterned structures 110 such that there is no exposure to atmospheric conditions between the etching and the encapsulation layer formation. One method to achieve such results is to perform the etching and the encapsulation layer formation in the same process tool while maintaining the substrate under vacuum control between the etching and formation steps. Thus, in this manner, the encapsulation formation steps may be performed in-situ with the etch steps. In one embodiment, the etching and formation steps may be performed in the same process chamber, in another embodiment within different process chambers of the same process tool (with no vacuum break between chambers), and in yet another embodiment within different process chambers of different process tools (with no vacuum break when moving the substrate between the different process tools).

As mentioned, after formation of the encapsulation layer 130, the queue time limits until subsequent process steps are performed may be relaxed. One common subsequent process step that may be performed post etch during substrate processing is a wet clean process. Thus, in one embodiment of the process described herein, advantageous relaxation of queue time control between a substrate etch process step and a substrate wet processing step is provided. As mentioned, the wet process step may be, in one embodiment, a wet clean process step.

After the formation of the encapsulation layer 130 as shown in FIG. 2, the substrate may then be subject to an encapsulation removal process step as shown in FIG. 3. In this manner, patterned structures 110 are provided again unencapsulated, similar to FIG. 1. Due to the benefits of the encapsulation layer, strict queue time limits as to when the encapsulation removal process occurs relative to the etch step that formed the patterned structures 110 is not necessary. Further, the encapsulation removal step may be provided in a manner that not only removes the encapsulation layer but also any residues or etch products that may have resulted from the etch and that may react with atmospheric conditions. Thus, strict queue time limits are not necessary after the encapsulation removal step.

In one embodiment, the encapsulation removal step may be a wet processing step that also acts as a wet clear process step. Thus, the encapsulation removal step may be incorporated as part of a normal wet clean process that occurs after the etching of the patterned structures 110. In one embodiment, the wet clean process may be a Standard Clean (SC1)

process. In other embodiments, other commercially available acidic or alkaline cleans may be utilized. Depending upon the materials used for the encapsulation layer and/or the particular wet clean process, the wet clean process itself may accomplish removal of the encapsulation layer in addition to the cleaning action. Alternatively, additional wet processing steps may be added that perform the removal action in addition to the cleaning process steps. In this manner, a process is provided in which the queue time control limits between an etch step and a subsequent wet processing step may be relaxed. In one exemplary embodiment, queue time limits without the use of the techniques provided herein may be in the range of 0 to 3 hours and the use of the techniques provided herein may remove the need for any queue time limit all together. It will be recognized, however, that such limits are merely exemplary.

In one embodiment, the encapsulation layer 130 is a thin layer between 0.5 nm and 1 nm thick. In one embodiment, the encapsulation layer 130 is a layer formed by an atomic layer deposition process. The encapsulation layer may be formed of a variety of materials including, for example but not limited to, silicon oxide, silicon nitride, silicon oxynitride, SiBCN, $C_xH_y$ films, or other thin layers (such as other layers formed by atomic layer deposition).

In one embodiment, the patterned structures 110 may be a structure comprising a metal. In another embodiment, the patterned structures 110 may comprise at least one titanium nitride layer. For example, the patterned structures may be a single layer structure comprised of titanium nitride or may be comprised of multiple layers, one of which comprises titanium nitride. In another embodiment, the patterned structures 110 may comprise at least one cobalt layer. For example, the patterned structures may be a single layer structure comprised of cobalt or may be comprised of multiple layers, one of which comprises cobalt. In one embodiment, such as shown in FIG. 1, the first layer 115 may comprise silicon oxide and a second layer 120 may comprise titanium nitride. In another embodiment, such as shown in FIG. 1, the first layer 115 may comprise tetraethyl orthosilicate (TEOS) and the second layer 120 may comprise cobalt. As mentioned, however, the patterned structures may have more or less layers and may be formed of other materials. In one exemplary process, the titanium nitride may be utilized as a hard mask as part of back end of line (BEOL) processing of a semiconductor wafer.

In one embodiment, the processing techniques utilized herein may advantageously be utilized when a titanium nitride or cobalt containing structure is exposed to a fluorocarbon containing plasma etch. It will be noted, that the exposure of the titanium nitride or cobalt to a fluorocarbon containing plasma etch may result from a particular etch step that etches the titanium nitride or cobalt or alternatively, may result from a particular etch step that is used to etch a layer above or below the titanium nitride or cobalt layer. For example, a fluorocarbon etch used to etch the first layer 115 may impact the second layer 120 (for example a titanium nitride or cobalt based second layer). This may be particularly important if a wet clean process needs to be performed between the etching of first layer 115 and second layer 120. An exemplary process flow utilizing an encapsulation layer between the etch steps of layers such as first layer 115 and second layer 120 is described in more detail below with regard to FIGS. 4-7.

n addition, the exposure to a fluorocarbon may come from etching a layer under the titanium nitride or cobalt layer. For example, in the embodiments of FIGS. 1-3, the second layer 120 may be a titanium nitride hard mask that is used as part of etching an underlying dielectric layer of the underlying layer(s) 105. In this embodiment, the encapsulation layer technique may be used after etching the underlying dielectric layer before a subsequent wet clean of the substrate so as to provide enhanced queue time limits to the wet clean process.

Figure 4:
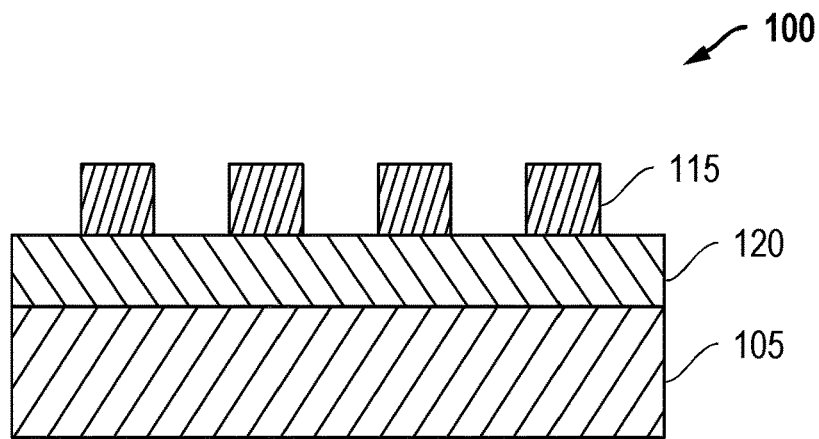
FIGS. 4-7 illustrate another exemplary substrate process flow utilizing an encapsulation layer to provide extended queue time control.
Figure 5:
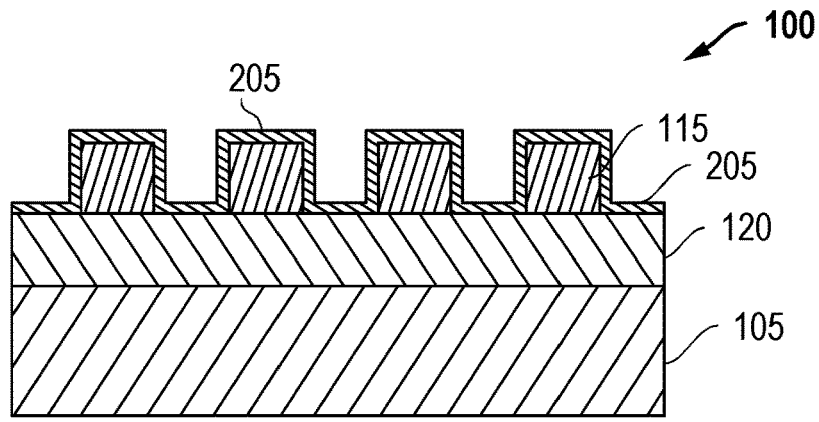
Figure 6:
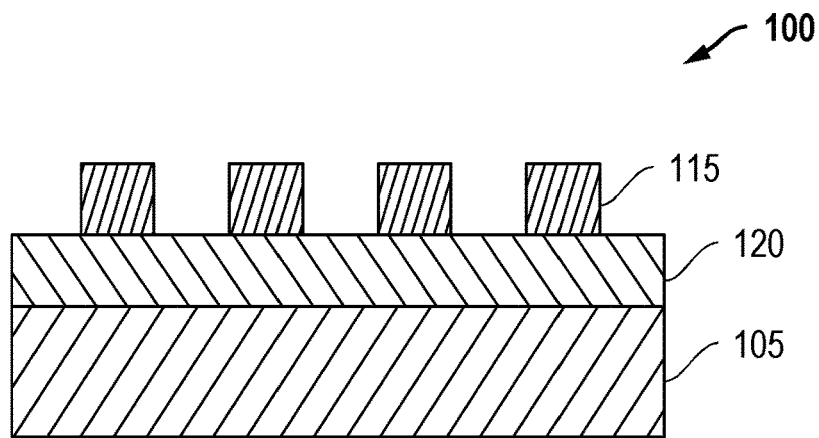

FIGS. 4-9 illustrate an alternative process flow utilizing the techniques described herein. It will be recognized that the various process flows shown in the figures herein are merely exemplary, and many other process flows may be utilized to obtain the advantages of the use of a post etch encapsulation as described herein. FIGS. 4-9 illustrate the processing of a substrate 100 that may provide a structure similar to the structures of FIGS. 1-3 except the process flow of FIGS. 4-7 may utilize additional processing between the etching of the first layer 115 and the second layer 120. More particularly, for example, a clean process may be required between the etching of the first layer 115 and the etching of the second layer 120. The encapsulation techniques described herein may be utilized to extend any queue times between the etching of the first layer 115 and the clean process. As shown in FIG. 4, the first layer 115 may be etched to provide a patterned first layer. Then, as shown in FIG. 5, a first encapsulation layer 205 may be provided over the substrate 100 after the etching of the first layer 115. As described above, in one exemplary embodiment, the formation of the first encapsulation layer 205 may be atomic layer deposition process performed in-situ with the etching of the first layer. Next, a cleaning step may be performed that also removes the first encapsulation layer 205 to yield the substrate 100 as shown in FIG. 6. The use of the first encapsulation layer 205 provides relaxation of queue time limits between the etching of the first layer 115 and the subsequent processing steps (in this case a subsequent clean) similar to as described above.

Figure 7:
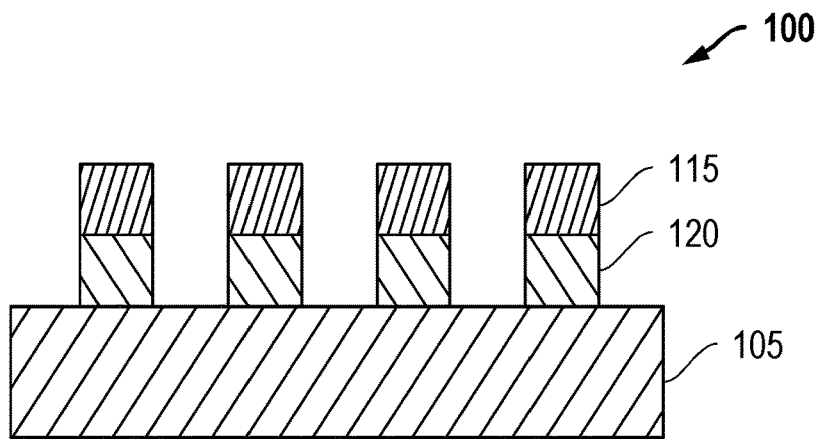
Figure 8:
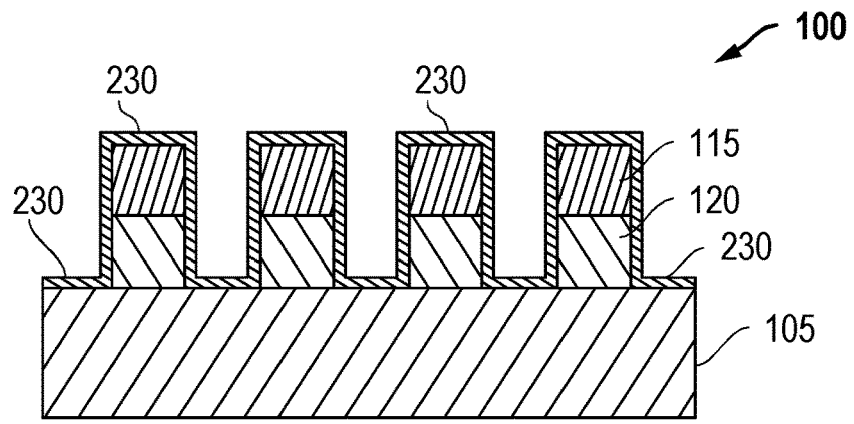
FIGS. 8-9 illustrate another exemplary substrate process flow in which a second encapsulation layer is utilized after the processing as shown in FIGS. 4-7.
Figure 9:
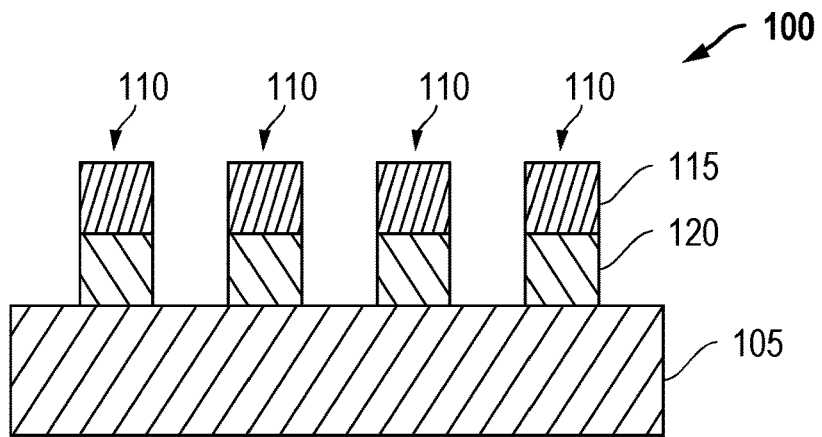

Next as shown in FIG. 7, the second layer 120 may be etched to form the patterned second layer as shown in the figure. FIGS. 8 and 9 illustrate the optional use of providing a second encapsulation layer 230 which may be utilized if residues and/or defects may result from exposure of the structure of FIG. 7 to atmospheric conditions. Specifically, the processing of FIGS. 8 and 9 may be similar to that of FIGS. 2 and 3. In the case of FIGS. 8 and 9, the second encapsulation layer 230 is provided in FIG. 8 to provide post etch encapsulation and the associated queue time extension. The second encapsulation layer 230 may then be removed in subsequent processing to yield the structure shown in FIG. 9. Thus, encapsulation techniques may be utilized between a plurality of process steps, not merely a first and second process step but also third process step or more process steps of a process flow.

Figure 10:
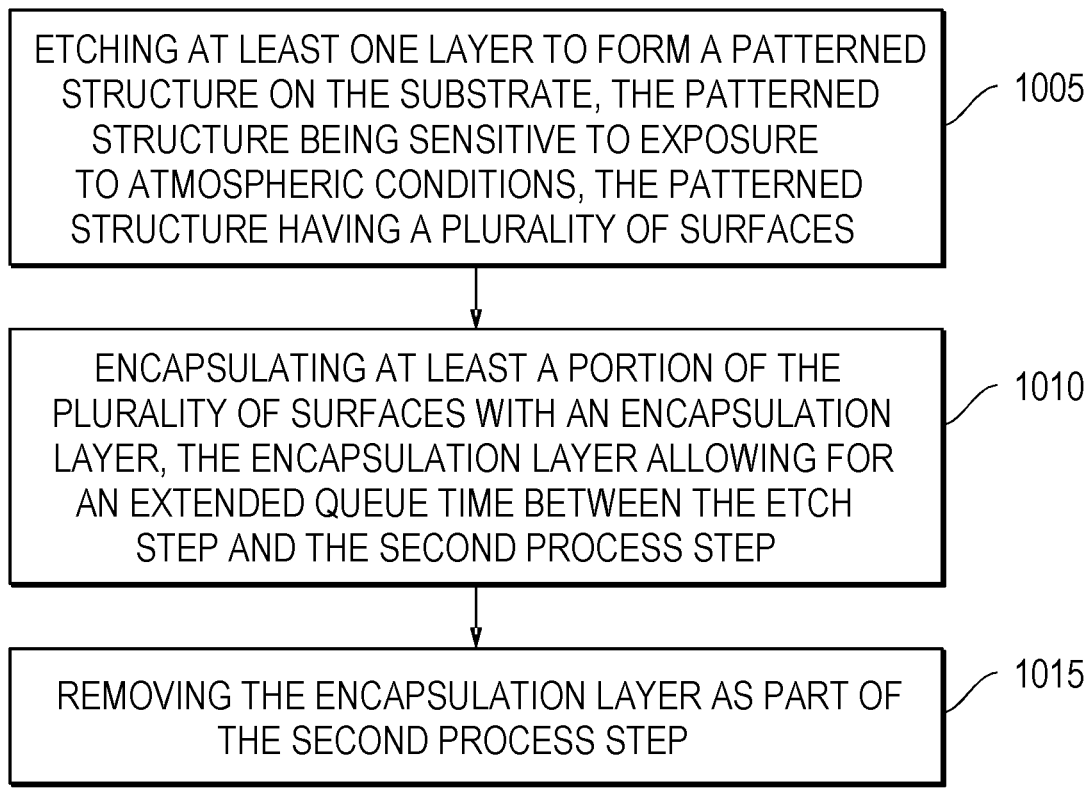
FIGS. 10-12 illustrate additional exemplary process flows utilizing the techniques described herein.
Figure 11:
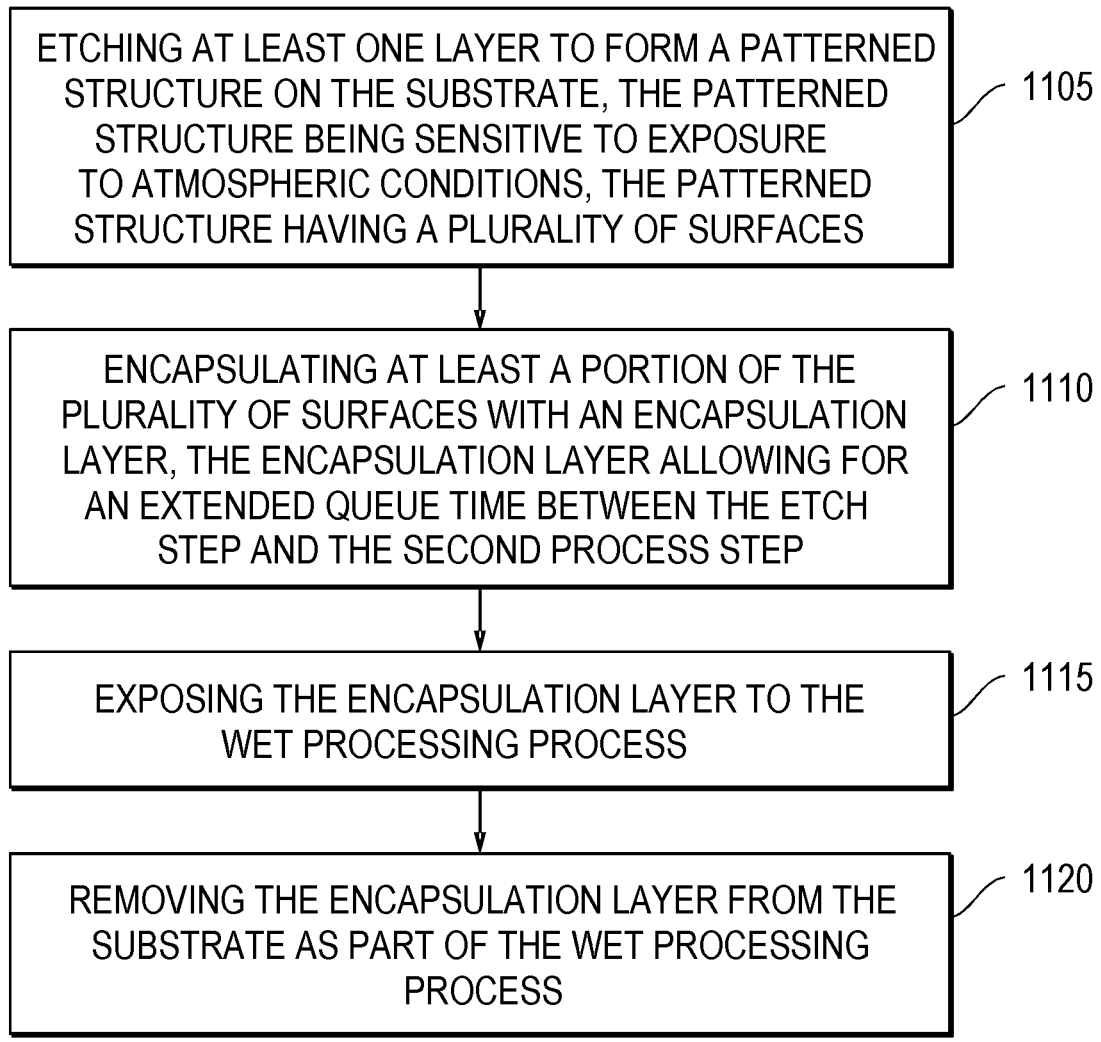
Figure 12:
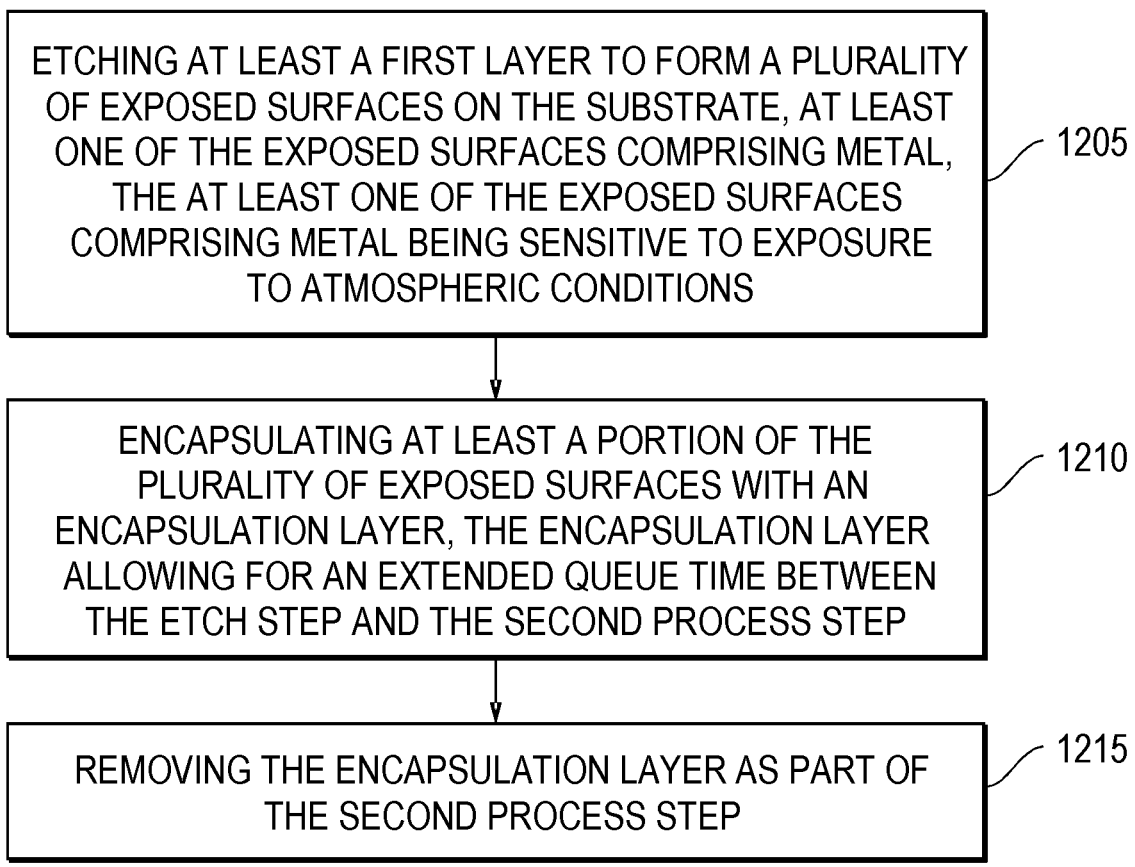

FIGS. 10-12 illustrate exemplary methods for use of the processing techniques described herein. It will be recognized that the embodiments of FIGS. 10-12 are merely exemplary and additional methods may utilize the techniques described herein. Further, additional processing steps may be added to the methods shown in the FIGS. 10-12 as the steps described are not intended to be exclusive. Moreover, the order of the steps is not limited to the order shown in the figures as different orders may occur and/or various steps may be performed in combination or at the same time.

In FIG. 10, a method of processing a substrate so as to extend a queue time between at least an etch step and a second process step is shown. The method may comprise step 1005 of etching at least one layer to form a patterned structure on the substrate, the patterned structure being sensitive to exposure to atmospheric conditions, the patterned structure having a plurality of surfaces. The method further comprises step 1010 of encapsulating at least a portion of the plurality of surfaces with an encapsulation layer, the encapsulation layer allowing for an extended queue time between the etch step and the second process step. The method also comprises step 1015 of removing the encapsulation layer as part of the second process step.

In FIG. 11, a method is provided for processing a substrate so as to extend a queue time between at least an etch step and a second process step, the second process step being a wet processing process. The method comprises a step 1105 of etching at least one layer to form a patterned structure on the substrate, the patterned structure being sensitive to exposure to atmospheric conditions, the patterned structure having a plurality of surfaces. The method includes step 1110 of encapsulating at least a portion of the plurality of surfaces with an encapsulation layer, the encapsulation layer allowing for an extended queue time between the etch step and the second process step. The method also includes step 1115 of exposing the encapsulation layer to the wet processing process and step 1120 of removing the encapsulation layer from the substrate as part of the wet processing process.

In FIG. 12 a method of processing a substrate is provided so as to extend a queue time between at least an etch step and a second process step. The method includes step 1205 of etching at least a first layer to form a plurality of exposed surfaces on the substrate, at least one of the exposed surfaces comprising a metal, the at least one of the exposed surfaces comprising a metal being sensitive to exposure to atmospheric conditions. The method also includes step 1210 of encapsulating at least a portion of the plurality of exposed surfaces with an encapsulation layer, the encapsulation layer allowing for an extended queue time between the etch step and the second process step. The method further includes step 1215 of removing the encapsulation layer as part of the second process step.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of processing a substrate so as to extend a queue time between at least an etch step and a second process step, the method comprising:
   the etch step including etching at least one layer to form a patterned structure on the substrate, the patterned structure being sensitive to exposure to atmospheric conditions, the patterned structure having a plurality of exposed surfaces which are exposed after the etching;
   encapsulating at least a portion of the plurality of exposed surfaces with an encapsulation layer, the encapsulation layer allowing for an extended queue time between the etch step and the second process step to cover the at least a portion of the plurality of exposed surfaces;
   after the encapsulation, exposing the substrate having the encapsulation layer thereon to atmospheric conditions;
   the second process step including after the exposing to atmospheric conditions, removing the encapsulation layer as part of the second process step and wherein during the removing, all exposed surfaces exposed after the etching and covered by the encapsulation layer become exposed again.

2. The method of claim 1, wherein at least one of the plurality of exposed surfaces of the patterned structure comprises a metal layer.

3. The method of claim 1, wherein the encapsulation layer is formed by an atomic layer deposition process and has a thickness of from 0.5 nm to 1 nm.

4. The method of claim 3, wherein the encapsulation layer is formed of silicon oxide, silicon nitride, silicon oxynitride, CxHy and/or SiBCN.

5. The method of claim 4, wherein at least one of the plurality of surfaces of the patterned structure comprises titanium nitride or cobalt.

6. The method of claim 1, wherein:
   the exposed surfaces exposed after the etching include a metal layer;
   the etching comprises performing a plasma etch, and during the plasma etch the metal layer is exposed to a fluorocarbon; and
   wherein the removing of the encapsulation layer is performed with a wet process.

7. A method of processing a substrate so as to extend a queue time between at least an etch step and a second process step, the method comprising:
   the etch step including etching at least one layer to form a patterned structure on the substrate, the patterned structure being sensitive to exposure to atmospheric conditions, the patterned structure having a plurality of surfaces;
   encapsulating at least a portion of the plurality of surfaces with an encapsulation layer, the encapsulation layer allowing for an extended queue time between the etch step and the second process step;
   the second process step including exposing the encapsulation layer to a wet processing process; and
   removing the encapsulation layer from the substrate during the wet processing process.

8. The method of claim 7, wherein the wet processing process is a Standard Clean 1 process.

9. The method of claim 7, wherein the etch step is a plasma etch step and the encapsulation layer is formed by an atomic layer deposition process.

10. The method of claim 9, wherein the encapsulation layer is formed of silicon oxide, silicon nitride, silicon oxynitride, CxHy and/or SiBCN.

11. The method of claim 9, wherein at least one of the plurality of surfaces of the patterned structure comprises a metal layer.

12. The method of claim 11, wherein at least one of the plurality of surfaces of the patterned structure comprises titanium nitride or cobalt.

13. The method of claim 7, wherein the substrate is maintained under vacuum between the etching at least one layer and the encapsulating at least the portion of the plurality of surfaces.

14. The method of claim 7, wherein:
   the etch step is a plasma etch step;
   the plurality of surfaces include exposed metal surfaces which are exposed after the etch step and before the encapsulating;
   during the encapsulating, the exposed metal surfaces are covered with the encapsulation layer;

after the encapsulating and prior to the wet processing process, the substrate is exposed to atmospheric conditions; and after removing the encapsulating layer all the exposed metal surfaces covered by the encapsulating layer are exposed again.

15. The method of claim 14, wherein the encapsulating is performed with an atomic layer deposition process to form the encapsulating layer with a thickness of 0.5 nm to 1 nm.

16. A method of processing a substrate so as to extend a queue time between at least an etch step and a second process step, the method comprising:

the etch step including etching at least a first layer with a plasma etch to form a plurality of exposed surfaces on the substrate comprising exposed metal surfaces, the exposed metal surfaces being sensitive to exposure to atmospheric conditions;

encapsulating at least a portion of the plurality of exposed surfaces with an encapsulation layer, the encapsulation layer allowing for an extended queue time between the etch step and the second process step, wherein during the encapsulating, the exposed metal surfaces are covered with the encapsulation layer; and the second process step including removing the encapsulation layer with a wet processing, wherein after the removing all exposed metal surfaces which were covered by the encapsulation layer are exposed again.

17. The method of claim 16, wherein the metal is titanium nitride or cobalt.

18. The method of claim 16, further comprising etching a second layer underlying the first layer after removing the encapsulation layer to form a patterned second layer on the substrate.

19. The method of claim 18, further comprising:

providing a second encapsulation layer over at least a portion of exposed surfaces of the patterned second layer, the second encapsulation layer allowing for an extended queue time between etching the second layer and a third process step; and removing the encapsulation layer as part of the third process step.

20. The method of claim 19, wherein the third process step is a wet processing.

21. The method of claim 20, wherein after the etch step and prior to the second process step or prior to the third process step the substrate is exposed to atmospheric conditions.

\* \* \* \* \*